United States Patent
Bremler-Barr et al.

(10) Patent No.: US 8,887,026 B2
(45) Date of Patent: Nov. 11, 2014

(54) EFFICIENT DETECTION OF ERRORS IN ASSOCIATIVE MEMORY

(75) Inventors: Anat Bremler-Barr, Ramat Hasharon (IL); David Hay, Haifa (IL); Danny Hendler, Kiryat-Ono (IL); Ron M. Roth, Haifa (IL)

(73) Assignees: Ben Gurion University of the Negev, Beer-Sheva (IL); Interdisciplinary Center Herzliya, Herzliya (IL); Technion Research & Development Foundation Ltd., Haifa (IL)

( * ) Notice: Subject to any disclaimer, the term of this patent is extended or adjusted under 35 U.S.C. 154(b) by 500 days.

(21) Appl. No.: 13/258,457

(22) PCT Filed: Apr. 12, 2010

(86) PCT No.: PCT/IB2010/051546
§ 371 (c)(1),
(2), (4) Date: Sep. 22, 2011

(87) PCT Pub. No.: WO2010/119381
PCT Pub. Date: Oct. 21, 2010

(65) Prior Publication Data
US 2012/0117431 A1 May 10, 2012

Related U.S. Application Data

(60) Provisional application No. 61/168,940, filed on Apr. 14, 2009.

(51) Int. Cl.
*G11C 29/00* (2006.01)
*G11C 15/00* (2006.01)
*G06F 11/10* (2006.01)
*G11C 29/08* (2006.01)

(52) U.S. Cl.
CPC ............ *G11C 15/00* (2013.01); *G06F 11/1008* (2013.01); *G06F 11/1064* (2013.01); *G11C 29/08* (2013.01)
USPC ........................................................ 714/773

(58) Field of Classification Search
CPC ........................ G06F 11/1064; G06F 11/1008
USPC ........................................................ 714/773
See application file for complete search history.

(56) References Cited

U.S. PATENT DOCUMENTS 5,214,715 A * 5/1993 Carpenter et al. ............ 382/157
6,067,656 A   5/2000 Rusu et al.

(Continued)

OTHER PUBLICATIONS

MacWilliams et al., "The Theory of Error Correcting Codes", North-Holland Mathematical Library, chapter 1, pp. 1-37, year 1977.

(Continued)

*Primary Examiner* — Joseph D Torres
(74) *Attorney, Agent, or Firm* — D. Kligler I.P. Services Ltd.

(57) ABSTRACT

A method for error detection includes storing in an associative memory multiple data entries, each data entry including a data item together with one or more check symbols computed with respect to the data item. A predetermined sequence of search keys is applied to the memory, thereby causing the memory to generate, in parallel, match results with respect to the data entries. The match results are processed in order to identify an error in at least one of the data entries.

19 Claims, 3 Drawing Sheets

(56) References Cited

U.S. PATENT DOCUMENTS

| | | | | |
|---|---|---|---|---|
| 6,253,280 | B1* | 6/2001 | Voelkel | 711/108 |
| 6,597,595 | B1* | 7/2003 | Ichiriu et al. | 365/49.18 |
| 6,697,275 | B1* | 2/2004 | Sywyk et al. | 365/49.17 |
| 6,697,276 | B1* | 2/2004 | Pereira et al. | 365/49.17 |
| 6,700,810 | B1* | 3/2004 | Ichiriu et al. | 365/49.18 |
| 6,728,124 | B1* | 4/2004 | Ichiriu et al. | 365/49.15 |
| 6,914,795 | B1* | 7/2005 | Srinivasan et al. | 365/49.18 |
| 6,934,796 | B1* | 8/2005 | Pereira et al. | 711/108 |
| 6,978,343 | B1* | 12/2005 | Ichiriu | 711/108 |
| 7,002,823 | B1* | 2/2006 | Ichiriu | 365/49.17 |
| 7,028,136 | B1* | 4/2006 | Priyadarshan et al. | 711/108 |
| 7,042,748 | B2* | 5/2006 | Khanna | 365/49.15 |
| 7,043,673 | B1* | 5/2006 | Ichiriu et al. | 714/719 |
| 7,050,318 | B1* | 5/2006 | Argyres | 365/49.15 |
| 7,082,492 | B2* | 7/2006 | Pullela et al. | 711/108 |
| 7,103,708 | B2* | 9/2006 | Eatherton et al. | 711/108 |
| 7,110,407 | B1* | 9/2006 | Khanna | 370/392 |
| 7,110,408 | B1* | 9/2006 | Nataraj | 370/392 |
| 7,124,200 | B2* | 10/2006 | Sato et al. | 709/239 |
| 7,177,978 | B2* | 2/2007 | Kanekar et al. | 711/108 |
| 7,193,877 | B1* | 3/2007 | Yelluru | 365/49.1 |
| 7,237,059 | B2* | 6/2007 | Eatherton et al. | 711/108 |
| 7,237,156 | B1* | 6/2007 | Srinivasan et al. | 714/719 |
| 7,257,763 | B1* | 8/2007 | Srinivasan et al. | 714/764 |
| 7,283,380 | B1* | 10/2007 | Srinivasan et al. | 365/49.17 |
| 7,305,519 | B1 | 12/2007 | Nagaraj | |
| 7,689,485 | B2* | 3/2010 | Kanekar et al. | 705/35 |
| 2003/0217321 | A1* | 11/2003 | Hsu et al. | 714/763 |
| 2004/0030803 | A1* | 2/2004 | Eatherton et al. | 709/245 |
| 2004/0105290 | A1* | 6/2004 | Khanna | 365/49 |
| 2004/0170171 | A1* | 9/2004 | Kanekar et al. | 370/392 |
| 2004/0170172 | A1* | 9/2004 | Pullela et al. | 370/392 |
| 2004/0172346 | A1* | 9/2004 | Kanekar et al. | 705/30 |
| 2005/0169031 | A1* | 8/2005 | Khanna | 365/49 |
| 2006/0106977 | A1 | 5/2006 | Eatherton et al. | |
| 2006/0123327 | A1 | 6/2006 | Foss et al. | |
| 2008/0288809 | A1 | 11/2008 | Koguchi et al. | |

OTHER PUBLICATIONS

Blahut, R.E., "Theory and Practice of Error Control Codes", Addison-Wesley, chapter 7, pp. 161-205, year 1983.

Bremler-Barr et al., "TCAM with Fast Error Detection", May 5, 2008.

Noda et al., "A cost-efficient high-performance dynamic TCAM with pipelined hierarchical searching and shift redundancy architecture," IEEE Journal of Solid-State Circuits, vol. 40, No. 1, pp. 245-253, Jan. 2005.

Noda et al., "A reliability-enhanced TCAM architecture with associated embedded PDRAM", IEICE Transactions on Electronics, vol. E89-C, No. 11, Nov. 2006.

Azizi et al., "A family of cells to reduce the soft-error-rate in ternary-CAM", Proceedings of Design Automation Conference, pp. 779-784, San Francisco, USA, Jul. 24-28, 2006.

Pagiantzis et al., "A soft-error tolerant content-addressable memory (CAM) using an error-correcting-match scheme", IEEE Custom Integrated Circuits Conference, pp. 301-304, San Jose, USA, Sep. 10-13, 2006.

Bremler-Barr et al., "PEDS: A Parallel Error Detection Scheme for TCAM Devices", IEEE/ACM Transactions on Networking, vol. 18, issue 5, pp. 165-1675, Oct. 2010.

Taylor, D. E., "Survey and taxonomy of packet classification techniques", ACM Computing Surveys, vol. 37, No. 3, pp. 238-275, Sep. 2005.

Pagiamtzis et al., "Content-addressable memory (CAM) circuits and architectures: A tutorial and survey", IEEE Journal of Solid-State Circuits, vol. 41, No. 3, pp. 712-727, Mar. 2006.

Mastipuram et al., "Soft errors' impact on system reliability", EDN, pp. 69-74, Sep. 30, 2004.

Miller et al., Investigating design criteria for searching databases, IDT, Feb. 2005.

Lakshminarayanan et al., "Algorithms for advanced packet classification with ternary CAMs", SIGCOMM conference, Philadelphia, USA, Aug. 12-26, 2005.

Liu, H., "Efficient mapping of range classifier into ternary-CAM", Proceedings of 10th symposium on High Performance Interconnects, pp. 95-100, year 2002.

Pao et al., "Field domain segmentation approach to filter encoding for efficient packet classification with TCAM", Proceedings of the 7th IASTED International Conferences on Wireless and Optical Communications, pp. 136-141, Montreal, Canada, May 30-Jun. 1, 2007.

Van Lunteren et al., "Fast and scalable packet classification", IEEE Journal on Selected Areas in Communications, vol. 21, No. 4, pp. 560-571, May 2003.

Zhang et al., "A code-based multi-match packet classification with TCAM", Advances in Web and Network Technologies, and Information Management, Lecture Notes in Computer Science, vol. 4537, pp. 564-572, Aug. 22, 2007.

Mohan et al., "Design techniques and test methodology for low-power TCAMs", IEEE Transactions on Very Large Scale Integration (VLSI) Systems, vol. 14, No. 06, pp. 573-586, Jun. 2006.

International Application PCT/IB2010/051546 Search Report dated Sep 16, 2010.

\* cited by examiner

EFFICIENT DETECTION OF ERRORS IN ASSOCIATIVE MEMORY

CROSS-REFERENCE TO RELATED APPLICATION

This application claims the benefit of U.S. Provisional Patent Application 61/168,940, filed Apr. 14, 2009, which is incorporated herein by reference.

FIELD OF THE INVENTION

The present invention relates generally to memory devices, and specifically to schemes for detection of errors in data stored in memory.

BACKGROUND OF THE INVENTION

Ternary content-addressable memory (TCAM) is a type of associative memory hardware device comprising a table of fixed-width TCAM entries. Each entry consists of W symbols, taking on the ternary alphabet {"0", "1", "*"}. {"0", "1"} are proper bit values, while "*" stands for "don't-care." The entry width of contemporary TCAM devices is typically configurable to a width of 72, 144, 288 or 576 symbols. The size (i.e. the number of TCAM entries) of contemporary TCAMs is orders-of-magnitude larger than their width: Current TCAMs, for example, can store, in a single device, more than 128K ternary entries that are 144 bits wide.

TCAM enables parallel matching of a key against all entries and thus provides high throughput that is unparalleled by software-based (or SRAM-based) matching solutions. The input to the TCAM is a ternary word of length W called a search key. Search key u matches entry v if the proper bits of u agree with those of v. The basic function of a TCAM is to simultaneously compare a search key with all TCAM entries in parallel. The index returned by the lookup operation is computed by a TCAM module called a match-line (ML) encoder. If there is a single matching TCAM entry, its index is output by the ML encoder. If several entries are matched by the search key, most TCAMs return the index of the highest priority entry, i.e., the entry with the smallest index; and this type of ML encoder is called a priority encoder.

TCAM devices are increasingly used for performing high-speed packet classification, which is an essential component of many networking applications, such as routing, monitoring and security. For packet classification, routers use a classification database, which contains rules (sometimes called filters). Each rule specifies a certain pattern, which is typically based on certain packet header fields, such as the source/destination addresses, source/destination port numbers and protocol type, and an action to apply to the packets that match the pattern. The patterns are stored as entries in the TCAM.

Memory chips suffer from error events (often called soft errors), which may be caused by low-energy alpha particles, neutron hits, or cosmic rays. In a TCAM error event, a TCAM symbol can change its value to any symbol in {"0", "1", "*"}. The problem of soft errors in conventional random access memory (RAM) is typically handled by appending check symbols to the data according to some error-detecting or error-correcting code (ECC), and then applying an ECC check to each memory word upon access. This sort of solution is impractical in TCAM, however, since all entries are accessed in parallel.

Soft errors in the TCAM device can cause various types of matching errors: An error in a TCAM entry may result either in the entry rejecting a search key, even though it should have returned a match (a false miss), or in an entry matching a search key that it should have rejected (a false hit). Matching a search key with the wrong entry can have adverse effects on the packet classification process, since different entries have different actions associated with them in the rule database. As an example, such an error may cause malicious packets that should have been dropped for security reasons to be erroneously forwarded, or vice versa.

SUMMARY

Embodiments of the present invention that are described hereinbelow provide efficient methods for detecting errors in associative memory devices, and particularly in TCAM.

There is therefore provided, in accordance with an embodiment of the present invention, a method for error detection, which includes storing in an associative memory multiple data entries, each data entry including a data item together with one or more check symbols computed with respect to the data item. A predetermined sequence of search keys is applied to the memory, thereby causing the memory to generate, in parallel, match results with respect to the data entries. The match results are processed in order to identify an error in at least one of the data entries.

In disclosed embodiments, storing the multiple data entries includes storing the data entries in a ternary content-addressable memory (TCAM).

Typically, each data item includes information symbols, and the check symbols are chosen so that the information symbols together with the check symbols constitute codewords of a linear code. In some embodiments, choosing the check symbols includes dividing each data entry into multiple clauses, and appending at least one check symbol to each clause so as to generate multiple data blocks within each entry, wherein each of the data blocks is a codeword of the linear code. Additionally or alternatively, applying the predetermined sequence of the search keys includes defining a parity-check matrix of the linear code, and constructing the search keys using test vectors taken from the parity-check matrix.

In some embodiments, processing the match results includes counting a respective number of the search keys that match each of the data entries. Typically, applying the predetermined sequence of the search keys includes choosing the search keys so that a given data entry is considered to be error-free if and only if the respective number of the search keys that match the given data entry is in a predetermined set T, and processing the match results includes identifying as erroneous at least one data entry for which the respective number is not in T. In disclosed embodiments, T is the set of even numbers or the set of numbers that are divisible by three.

In one embodiment, the data entries in the associative memory have respective match lines, coupled to feed respective match line values to a match-line encoder which outputs an index of a matching data entry in a normal operational mode of the associative memory, and counting the respective number includes accumulating the match line values using a respective modular counter on each of the match lines while operating the associative memory in a test mode.

In another embodiment, processing the match results includes cumulatively computing a hash function over the match line values while applying the sequence of the search keys, and inverting the hash function to identify one or more of the data entries in which the error has occurred.

There is also provided, in accordance with an embodiment of the present invention, memory apparatus, including an associative memory, which is configured to store multiple data entries, each data entry including a data item together with one or more check symbols computed with respect to the data item. A processor is coupled to apply a predetermined sequence of search keys to the memory, thereby causing the memory to generate, in parallel, match results with respect to the data entries, and to process the match results in order to identify an error in at least one of the data entries.

There is additionally provided, in accordance with an embodiment of the present invention, a memory device, including an associative array of data entries, which have respective match lines that are configured to output, in parallel, respective match values responsively to a search key that is applied to the array. A match-line encoder is coupled to receive respective match line values from the match lines and, in a normal operational mode of the memory device, to output an index of a data entry matching the search key. A test circuit is configured, in a test mode of the memory device, to evaluate a respective number of search keys in a test sequence that match each of the data entries, and to output an indication of an error in at least one of the data entries, based on the respective number.

The present invention will be more fully understood from the following detailed description of the embodiments thereof, taken together with the drawings in which:

DETAILED DESCRIPTION OF EMBODIMENTS

Overview

Figure 1:
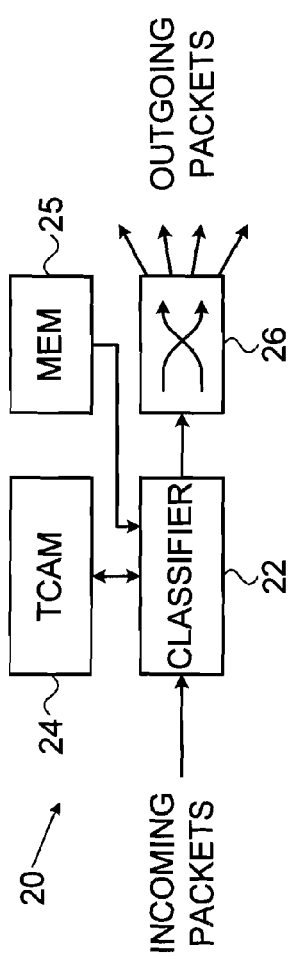
FIG. 1 is a block diagram that schematically illustrates a packet router using an error-detecting TCAM, in accordance with an embodiment of the present invention.

Embodiments of the present invention that are described hereinbelow provide efficient schemes for error detection in associative memory devices (also known as content-addressable memory-CAM). In these schemes, the memory stores multiple data entries, each comprising a data item, meaning the string of information symbols against which keys are compared in normal operation. (In packet classification, as described above in the Background, for example, these keys may be made up from header fields of incoming packets.) In binary CAM, the symbols are simply bits, whereas in TCAM the symbols may also take a "don't-care" value "*". In addition to the data item, each entry also comprises one or more check symbols computed with respect to the data item.

The associative memory is checked for errors periodically by applying a predetermined sequence of search keys to the memory. In disclosed embodiments, the check symbols are computed so that the entries, or component blocks making up the entries, constitute codewords of a certain selected code, and the keys are a set of test vectors associated with the code. These search keys are therefore referred to in the present patent application as "test keys." Methods for computing suitable check symbols and test keys of this sort are described in detail hereinbelow. Using the parallel associative capability of the memory, the test keys are applied to the data entries and cause the memory to generate, in parallel, match results for each key. These match results are processed in order to determine whether an error has occurred in the memory and, if so, to identify the data entry in which the error has occurred.

The number of simultaneous errors (per data item) that can be detected is a function of the choice of code and, accordingly, the numbers of check symbols and test keys that are used. The numbers of check symbols and test keys may be adjusted against one another to give an optimal tradeoff between the size of the data entries and the time required to complete the parallel error detection procedure. In any case, because the procedure is carried out in parallel, the time scales with the size of the data items, regardless of the number of entries in the associative memory. The testing may be carried out during idle cycles of the memory, and may be interleaved with active cycles of normal memory operation (for performing packet header lookup, for example). Little or no additional memory is required to implement the testing scheme, since the data items stored in the memory tend to be smaller than actual memory width—thus leaving vacant memory cells available to store the check symbols. Processing the match results requires only simple test logic to be added on-board the memory device.

Although the methods and circuits described in this patent application may be used in various types of associative memory, they are especially useful in TCAM devices, because they make use of the "don't-care" symbol and matching capability of the TCAM. Therefore, the embodiments described hereinbelow relate specifically to TCAM.

Solution Architecture

FIG. 1 is a block diagram that schematically illustrates a packet router 20 using an error-resilient TCAM 24, in accordance with an embodiment of the present invention. This specific embodiment is shown here to illustrate a typical use of a parallel error detection scheme in an associative memory device as an aid in understanding the present invention, and not by way of limitation. Other associative memory applications (and particularly TCAM applications) in which this sort of parallel error detection may be used will be apparent to those skilled in the art upon reading the present patent application and are considered to be within the scope of the present invention.

A classification processor 22 receives and classifies incoming packets based on a predefined set of rules. Each rule is associated with one or more entries in TCAM 24. Processor 22 extracts a string of bits from each incoming packet and applies the string as a search key to TCAM 24. The TCAM returns the index of the entry that was found to match the string (or the lowest such index if there were multiple matching entries), or else returns a "no match" indication. (Typically, there is a default rule at the end of the set, so that "no-match" is just another entry.) Processor 22 then classifies the packet according to the corresponding rule. After applying the appropriate rule, the processor either drops the packet or passes it to a switch 26, which conveys the packet to one or more output ports of router 20.

Each entry in TCAM 24 includes both the data item against which strings are matched and one or more check symbols. Periodically, processor 22 tests the integrity of the data entries in TCAM 24 by applying a set of test keys to the TCAM. As noted above, this testing can be carried out during idle cycles, when there are no packets waiting for classification. The processor may maintain a mirror of the contents of TCAM 24 in a backup memory 25, such as a dynamic random access memory (DRAM). When the test results indicate that an error has occurred in one of the TCAM entries, processor 22 overwrites the erroneous entry in TCAM 24 with the corresponding entry in backup memory 25. Packet classification then proceeds normally.

Figure 2:
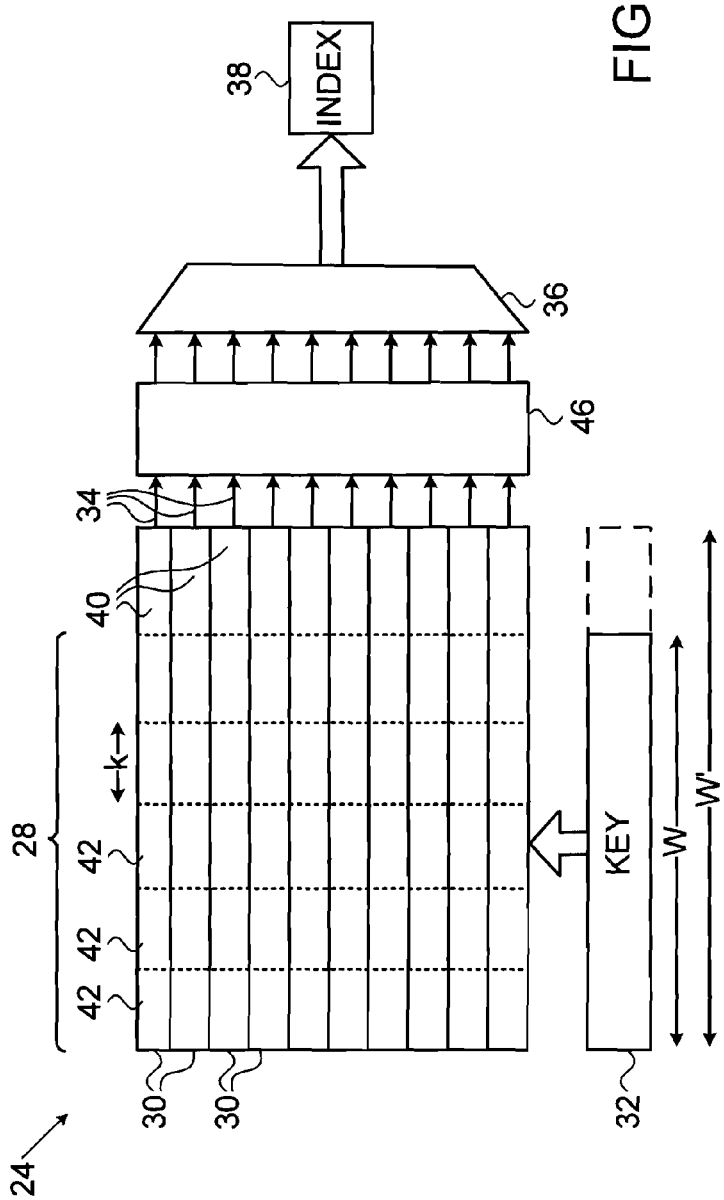
FIG. 2 is a block diagram that schematically illustrates the high-level architecture of a TCAM with parallel error detection, in accordance with embodiments of the present invention.

FIG. 2 is a block diagram that schematically illustrates the high-level architecture of TCAM 24, in accordance with embodiments of the present invention. TCAM 24 comprises an array of data entries 30. Each data entry comprises a data item 28, along with check symbols 40. The data items have a width of W symbols, while the data entries, including the check symbols, have the extended width W'>W. For purposes of error detection, each data item 28 is divided into W/k clauses 42, each of width k symbols. For convenience, it will be assumed that W is an integer multiple of k (since in any event W can be padded with "*" symbols if necessary). In some embodiments, entries 30 may contain only a single clause, i.e., W=k. One or more check symbols 40 are computed and stored for each clause 42, thus extending each clause into a block of n=W'/k symbols. Although clauses 42 and check symbols 40 are shown in FIG. 2 as separate entities, in practice the symbols of the various clauses and the check symbols may be physically interleaved in the memory to increase resilience against errors occurring in adjacent symbols. For example, clause x may contain all the data item symbols whose index modulo k is x.

For both matching and testing purposes, processor 22 (FIG. 1) inputs keys 32 to TCAM 24. In normal operation (for matching actual packet headers, for example), the processor may place "*" symbols in the positions in key 32 that correspond to check symbols 40, so that only the data items participate in matching. Testing, on the other hand, is typically carried out over all symbol positions in entries 30, by applying a set of test vectors to each block in turn, over all entries in parallel, with "*" symbols at other positions in the key.

In both normal operation and test mode, all entries 30 output their match results—"1" (match) or "0" (no match)— in parallel on corresponding match lines 34. These match results pass through a test circuit 46 (comprising logic and possibly memory), whose function is described below, to a match line encoder 36, which outputs, in normal operation, an index 38 of the entry (or indices of entries) that matched the current key. As noted above, encoder 36 may be configured as a priority encoder and thus output the lowest matching index.

When TCAM 24 operates in test mode, test logic 46 processes the match results in order to detect errors. The test logic may feed the test results to encoder 36 for output to processor 22 in the form of index 38. Alternatively, the test logic may have a separate output, as shown, for example, in FIG. 5.

Figure 3:
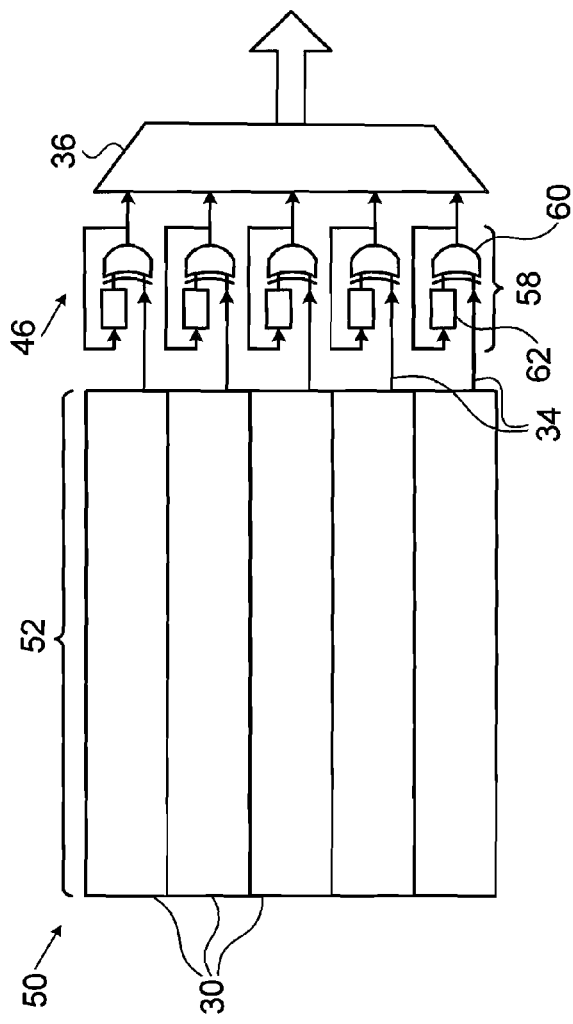
FIG. 3 is a block diagram that schematically illustrates a TCAM with parallel error detection, in accordance with one embodiment of the present invention.

In some embodiments of the present invention, the set of test keys is chosen to have the following property: Subject to certain limitations on the distribution of errors in the memory, an entry 30 is error-free if and only if the number of test keys that match it is an integer that belongs to a predetermined set T. Test logic 46 counts the number of matches per entry and determines whether that number belongs to T. This mechanism is the only hardware change required relative to the conventional TCAM array. FIG. 3, described below, shows a specific embodiment in which T is the set of even integers.

As one simple example, suppose that for each data item 28 of width W, check symbols 40 comprise W extra symbols, such that each original symbols is duplicated, and W'=2W.

(This implementation is not practical in most cases because it requires an excessive number of check symbols, but it is useful in understanding aspects of the present invention.) Let the j-th pair of symbols denote the original j-th symbol and its duplicate. For example, the data item "0*10" will be coded in the TCAM as "00**1100", wherein "*" is the second pair of symbols. In this case, if we assume that only one error can occur in each pair of symbols, the entry is correct if and only if the symbols in each pair are equal.

The correctness of the entries can be checked by iteratively checking, for each j, the correctness of the j-th pair simultaneously for all entries. This check is done by applying two test keys:

$$(*^{2(j-1)})01(*^{2W-2j}) \text{ and } (*^{2(j-1)})10(*^{2W-2j})$$

for j=1, ..., W, wherein $*^m$ means m successive "*" symbols. If neither of the search keys matches a given entry, then this entry is correct since the j-th pair is either "00" or "11". The entry is also correct if it is matched by both search keys, since then the j-th pair has to be "**". On the other hand, if only one search key matches the entry, then the entry is necessarily incorrect, since it means that the symbols in the j-th pair are not identical.

Thus, if the number of matches is even, the entry is correct, whereas an odd number of matches means the entry contains an error. In this case (and in other embodiments) test logic 46 may simply comprise a modulo-2 counter at the end of each match-line 34. The resilience of the code is W errors, with the restriction that no two errors occur in the same pair. The code requires W extra symbols per entry, and the time required to detect all errors is 2W lookups.

More generally, check symbols 40 may be chosen to be appended to clauses 42 so that the clauses together with their respective check symbols are codewords of a linear code. Formally a linear [n,k,d] code C over a finite field Ψ is a set of $|\Psi|^k$ vectors, referred to as codewords, of length n over Ψ that form a linear space of dimension k over Ψ, wherein the minimum (Hamming) distance between any two distinct codewords in Ψ is d. A coder (also known as an encoder) for C is any one-to-one mapping from $\Psi^k$ into C. A vector u in $\Psi^k$ may be coded by appending n−k check symbols to u, thereby forming the respective image codeword in C. The value n−k is the redundancy of the code.

Any suitable linear code may be used to choose the check symbol (or symbols) 40 to append to each clause 42. The finite field Ψ over which the code is defined for ordinary binary CAM is GF(2), containing the elements 0 and 1; while GF(3), containing +1, −1, and 0 (mapped respectively in our case to "0", "1" and "*"), can be used for TCAM, with addition and multiplication taken modulo 3. The simple example described above, in which each original symbol is duplicated, is the linear [2, 1, 2] code, whose codewords are (0,0),(+1,+1), and (−1,−1). For simplicity in the description that follows, the field GF(3) will be referred to as Φ.

One well-known type of linear code that can be used in embodiments of the present invention is the parity code. The parity code over a field Ψ is a linear [k+1, k, 2] code consisting of $|\Psi|^k$ vectors in $\Psi^{k+1}$ whose coordinates sum to zero (in Ψ). In this case, for each vector u in $\Psi^k$ (i.e., each clause 42 in FIG. 2), the coder appends a single check symbol which equals the additive inverse of the sum (in Ψ) of the k coordinates of u. Thus, the redundancy of the code is 1. Alternatively, linear codes with higher redundancy may be used in choosing check symbols 40, with two or more check symbols added to each clause.

In some embodiments that are described below, the test keys are constructed from the parity-check matrix of the code that is used to choose check symbols 40. Formally, the parity-check matrix H of code C is an r×n matrix over $\Psi$ with the property that C forms its right kernel, i.e.: $C=\{v\in\Psi^n:Hv^T=0\}$. Here the T superscript denotes transposition, the product $Hv^T$ is carried out over the field $\Psi$, and 0 stands for the all-zero vector. A parity-check matrix of this sort can be associated with any linear code C. The number of rows r must be at least the redundancy n−k of C, and equality (r=n−k) can be attained when H is selected to have linearly-independent rows over $\Psi$. Given a parity-check matrix H of a linear code C as defined above, the syndrome s of vector v is the column vector $s=Hv^T$. Thus, s=0 if and only if v∈C. As long as there can be no more than d errors in a vector v, the syndrome of v will be zero if and only if no errors have occurred in v.

Referring back now to FIG. 2, the keys 32 that are used to test clauses 42 together with their respective check symbols 40 may be based on the rows of a parity check matrix H of the code C that is used in choosing the check symbols to append to each clause. The choice of the test keys depends, inter alia, on the configuration of test logic 46. A number of such configurations, along with corresponding codes and test keys, are described below.

Error Detection Using Modulo-2 Counters

FIG. 3 is a block diagram that schematically illustrates a TCAM 50 with parallel error detection, in accordance with one embodiment of the present invention. This TCAM is a specific instance of the architecture exemplified by TCAM 24 in the preceding figures. TCAM 50 comprises an array 52 of entries 30, each comprising W/k blocks of n symbols, including k information symbols and n−k check symbols. The check symbols and the set of test keys are chosen based on a parity code so as to satisfy the following criterion: The number of test keys that match a given entry will be even if and only if the entry is error-free. This criterion will be referred to herein as the "evenness criterion." A method that can be used to define sets of test keys for this purpose is described below.

Given this evenness property of the code and the test keys, test logic 46 may simply comprise a modulo-2 counter 58 on each match line 34. Such a counter may be made from a XOR gate 60 and a single-bit register 62 (such as a flip-flop), arranged as shown in the figure. A given counter 58 is incremented each time the corresponding entry 30 matches a given test key 32 in the test sequence. After the sequence has been completed, register 62 will hold the value 0 if entry 30 has matched an even number of keys, and the value 1 if there was an odd number of matches. Encoder 36 will output the index of the lowest entry for which the respective register 62 contains the value 1 (or a null output if all registers contain 0). In the unlikely event of errors in multiple entries, the remaining erroneous entry (or entries) will be revealed in the next test round(s), after the lower erroneous entry has been rewritten with the correct value.

In normal operation of TCAM 50, for matching packet header patterns, for example, registers 62 may be latched at the value 0, so that test logic 46 is transparent to match lines 34.

To derive a set of test keys meeting the evenness criterion, we assign check symbols to the clauses in entries 30 in array 52 so that each block of n symbols is a codeword of a linear code C, and find a corresponding parity check matrix H. This matrix is made up of row vectors $h_1, h_2, \ldots, h_r$. We define the support of a vector $u=(u_1, u_2, \ldots, u_n)$ over the field $\Phi$ as $J(u)=\{j:u_j\neq 0\}$ (wherein the value 0 in $\Phi$ corresponds to TCAM symbol "*"). In terms of TCAM function, two vectors u and v are said to match if $u_j=v_j$ for every $j\in J(u)\cap J(v)$. For each row vector $h_i$ in H, a corresponding test set L is defined as $L(h_i)=S(h_i;+1)\cup S(h_i;-1)$, wherein the set of vectors $S(h;b)=\{u\in\Phi^n:J(u)=J(h) \text{ and } h\cdot u^T=b\}$.

The elements of set L are test vectors of length n. As shown in the above-mentioned provisional patent application, for a given block v, $h\cdot v^T=0$ if and only if the number of vectors in L(h) that match v is even. This finding leads to the following result for any given entry 30, which is made up of codewords of a linear [n,k,d] code C over $\Phi$ (subject to the assumption that each codeword contains less than d errors): The entry is considered to be error-free if and only if the number of test vectors in $L(h_i)$ that match every one of the blocks in the entry is even for every i=1, 2, ..., r. To test each block in turn, the set of test vectors of length n is expanded into a set of test keys of length W' by adding appropriate numbers of "*" symbols before and after each test vector. Thus, using a linear code and a corresponding parity matrix, the above definitions may be used to find a set of test keys meeting the evenness criterion.

To locate erroneous entries 30 in array 52, processor 22 (FIG. 1) may apply the test vectors and test keys defined above and the circuitry shown in FIG. 3 in the following algorithm:

LISTING 1

```
1:  for j ← 1 to W/k do
2:      for i ← 1 to r do
3:          Reset all modulo-2 counters
4:          for all a ∈ L(h_s) do
5:              Apply search key * * *  ....  * *  a  * * *  ....  * *
                                × n(j−1)          × (W^i − nj)
                  ▷ where W^i = nW/k
6:              Apply a clock pulse to all modulo-2 counters
7:          end for
8:          Flag as erroneous all TCAM entries whose match-lines
                  feed "1" to the priority encoder
9:      end for
10: end for
```

The parity matrix H, from which the vectors $\{h_i\}$ are extracted, may be derived by any suitable method known in the art. The above-mentioned provisional patent application presents a number of possible matrices and methods that may be used to choose the matrix so as to reduce the computational burden involved in TCAM error detection. As one example, the following parity-check matrix of the linear [9,6,3] code over $\Phi$ may be used:

$$H = \begin{pmatrix} 0 & 0 & 0 & 0 & + & + & + & + & + \\ 0 & + & + & + & 0 & 0 & 0 & + & - \\ + & 0 & + & - & 0 & + & - & 0 & 0 \end{pmatrix}$$

(Here "+" and "−" respectively stand for +1 and −1.) This matrix may be applied to clauses of length k=6, with redundancy n−k=3, whereby the number of detectable errors per block is d−1=2. For each row in this matrix, $|L(h_i)|=22$, meaning that 66 test vectors are needed per block, or 66*W/k test keys in total.

When the minimum distance d is fixed, the parameter k defines a trade-off between the following metrics:

1) Resilience: Since the number of detectable errors per block is fixed, a poorer (i.e., higher) error rate requires using a smaller k.

2) Space: The number of check symbols per entry is proportional to the number W/k of blocks (or clauses) per entry and, therefore, drops as k increases.
3) Time: The number of search keys that must be applied for complete error detection increases (exponentially) with k.

Figure 4:
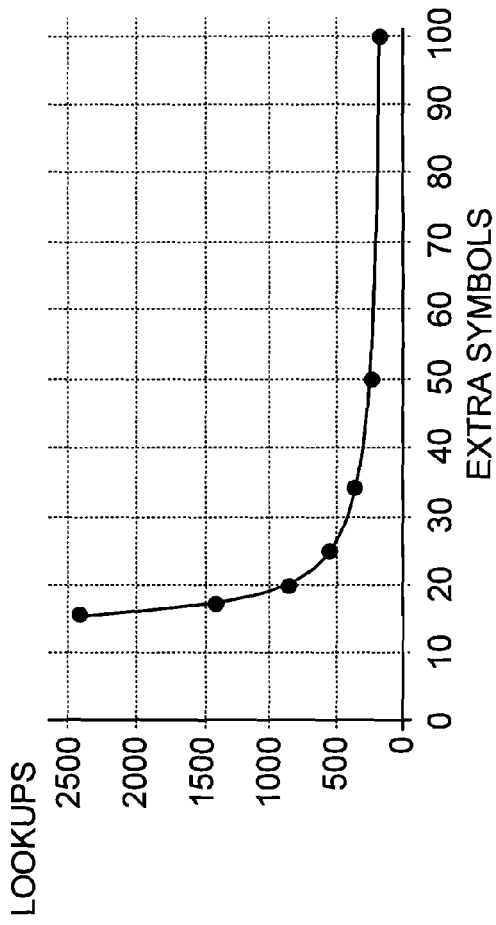
FIG. 4 is a plot that schematically illustrates a relation between lookup time and check symbols used in implementing an error detection scheme, in accordance with an embodiment of the present invention.

FIG. 4 is a plot that schematically illustrates the relationship between the latter two metrics, in accordance with an embodiment of the present invention. The plot shows the number of lookups required to test a memory containing entries of a given length as a function of the number of check symbols (i.e., bits) added to each clause, assuming C is a parity code (d=2), and W=100. Under these conditions, setting k=3, 4 or 5 (corresponding to 34, 25 or 20 total check symbols) gives a practical balance between memory use and lookup time.

"Non-Invasive" Error Detection

Figure 5:
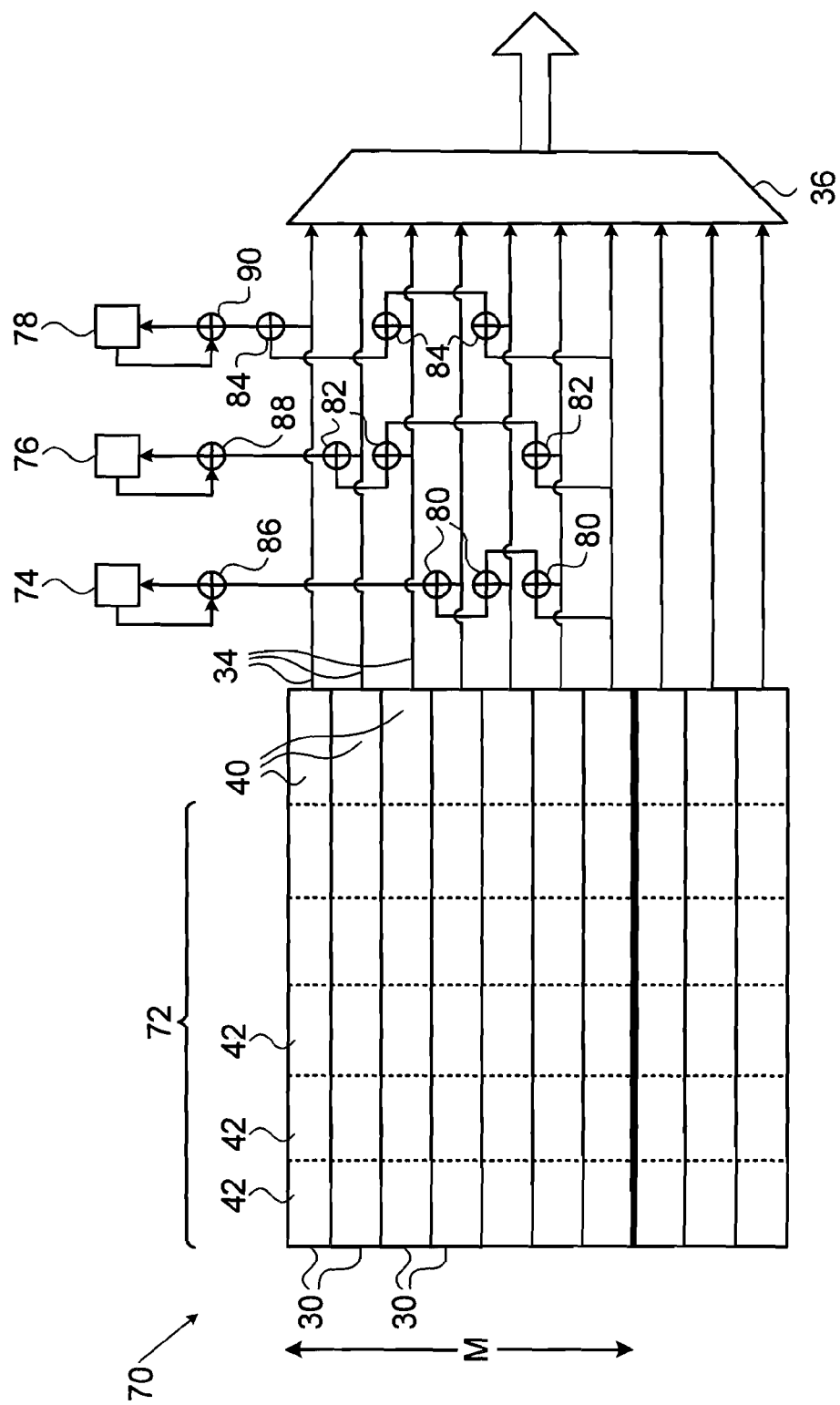
FIG. 5 is a block diagram that schematically illustrates a TCAM with parallel error detection, in accordance with another embodiment of the present invention.

FIG. 5 is a block diagram that schematically illustrates a TCAM 70 with parallel error detection, in accordance with another embodiment of the present invention. In this embodiment, the test logic is external to the functional TCAM circuit, rather than in line between the match lines and the encoder as in the preceding embodiment. (Alternatively, the sort of test logic shown in FIG. 5 could actually serve as the priority encoder, as well.) The architecture of this test logic assumes, however, that no more than a certain number of errors t (one error in the pictured example) will occur simultaneously in any group of M entries 30 in an array 72 of entries in TCAM 70. FIG. 5 shows only the test logic that is associated with one such group, in which M=7 (whereby three binary registers are sufficient to locate the error). Alternatively, this same logic may be replicated to test multiple groups extending over all the entries in the array, or other logic configurations may be used for other values of M and t.

In TCAM 70, match lines 34 are tapped off to sequences of binary adders (XOR gates) 80, 82, 84, which compute the sums, modulo-2, of the match values on respective sets of the match lines for each test key that is applied to array 72. Each sequence of adders feeds a respective modulo-2 accumulator, comprising a binary register 74, 76, 78 (such as a flip-flop) and a binary adder 86, 88, 90. After a sequence of test vectors has been applied to a certain block over the entries in array 72, registers 74, 76, 78 will hold the respective values {0,0,0} if no errors have occurred in any of the M entries. If an error has occurred, the registers together will hold the index of the erroneous entry, from 001 for the uppermost entry in the figure to 111 for the lowermost.

The principles of this embodiment can be generalized as follows: For every a∈L($h_i$), let $y_a$ be a "snapshot" column vector in $B^M$ that contains the match line values that appear when the test vector a is applied to the TCAM. (Here B is used to denote GF(2).) In other words, each coordinate in $y_a$ holds the value from the corresponding match line. Referring back to the inner loop of the algorithm in Listing 1 above, the contents of the modulo-2 counters after all test vectors a have been applied to a given block is the result vector:

$$y = \sum_{a \in L(h_i)} y_a$$

wherein the sum is taken over B. Assuming that there are no more than t errors in the M entries for which the calculation is performed, the Hamming weight of y is at most t.

To read out the values in y compactly to external test logic, a hash function H' is defined from $B^M$ to $B^\rho$, wherein $\rho<M$. In the example shown in FIG. 5, M=7 and $\rho=3$. More generally, the hash function may be defined in terms of a linear [M,K, 2t+1] code C' over B, wherein $2^K$ is the size of C'; and the hash function H' is a $\rho \times M$ parity check matrix of C'. This hash function maps the M-bit vector y into its p-bit syndrome s, and as long as the Hamming weight of y is no more than t, the hash function may be inverted to recover y from s. Certain types of linear codes in particular, such as BCH codes (including Hamming codes), facilitate efficient computation of the inverse mapping from syndromes to the original vectors.

Thus, instead of maintaining a modulo-2 counter on each match line to read out y directly, the hash function H' may be applied cumulatively by the external test logic to compute the syndrome s incrementally over the successive "snapshots":

$$s = \sum_{a \in L(h_i)} H' y_a$$

The multiplication by H' may be carried out using a suitably-configured array of XOR gates, as in the example shown in FIG. 5. After the last snapshot has been added to the sum, processor 22 (FIG. 1) reads out the value of the syndrome and, if it is non-zero, applies the inverse hash function in order to recover y and identify the erroneous entry.

Error Detection Using Modulo-3 Counters

In an alternative embodiment of the present invention, modulo-2 counters 58 that are shown in FIG. 3 are replaced by modulo-3 counters. Such counters can be made, for example, from a two-bit register and a ternary semi-adder. This latter device adds two elements of Φ, one of which is nonnegative (0 or +1), and can be realized using eight NAND gates. The present embodiment thus requires some additional hardware but has the advantage of generally higher speed than the preceding embodiments.

As in the preceding embodiments, the present embodiment uses a set of test vectors that are based on the rows $h_1$, $h_2$, ..., $h_r$ of a parity check matrix H of a linear [n,k,d] code C over Φ. In the present case, however, the TCAM entries are not divided into clauses or blocks; rather, each entry is treated as a single block, with k=W and n=W'. (This choice makes the outer loop in Listing 1 unnecessary.) Furthermore, the test sets L($h_1$) that were used in the preceding embodiments are replaced by multisets L'($h_i$). Such multisets are defined, for a given vector h in $\Phi^n$, by the expression:

$$L'(h) = \bigcup_{m:h_m \neq 0} U_m(h_m)$$

wherein $U_m(+1)=\{e_m, -e_m, -e_m\}$, and $U_m(-1)=\{-e_m, e_m, e_m\}$, and $e_m$ is the unit vector in $\Phi^n$ having +1 in position m and 0 elsewhere (meaning, in terms of the TCAM alphabet, "0" in position m and "*" elsewhere).

It can be shown that as long as no TCAM entry can contain more than d−1 errors, an entry in the TCAM will be error-free if and only if, for every row vector $h_1, h_2, \ldots, h_r$ in H, the number of test keys in L'($h_i$) that match the entry is divisible by 3. Thus, a processor tests the entries in the TCAM by applying the multisets of all the row vectors in H to the TCAM, and flagging as erroneous the entries whose modulo-3 counters give a non-zero result at the conclusion of any multiset. Alternatively, the modulo-3 counting may be performed by an external test circuit, which computes and outputs a hash function of the index of the erroneous entry as in the embodiment of FIG. 5.

Because the present embodiment applies the test keys to the entire W'-symbol entry at once, rather than breaking the entry into smaller blocks, it generally requires a much smaller number of operations and thus runs faster than the preceding embodiments. The number of test keys required in the present embodiment will be no greater than 3rW'. This number can be reduced to 2rW' by eliminating duplication of elements in the multisets, at the cost of having to use more complex modulo-3 counters, which are also capable of counting backward.

Although the embodiments described above relate to TCAM and include certain specific circuits and algorithms for detecting errors in TCAM, the principles of the present invention, wherein multiple entries in an associative memory are tested for errors simultaneously using appropriate test keys, may be implemented using other circuits and algorithms, and may also be applied, mutatis mutandis, to other types of associative memory. All such alternative implementations and applications of these principles are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for error detection, comprising:
storing in an associative memory multiple data entries, each data entry comprising a data item together with one or more check symbols computed with respect to the data item,
wherein each data item comprises information symbols, and wherein storing the multiple data entries comprises choosing the check symbols so that the information symbols together with the check symbols constitute codewords of a linear code;
applying a predetermined sequence of search keys to the memory, thereby causing the memory to generate, in parallel, match results with respect to the data entries,
wherein applying the predetermined sequence of the search keys comprises defining a parity-check matrix of the linear code, and constructing the search keys using test vectors taken from the parity-check matrix; and
processing the match results in order to identify an error in at least one of the data entries.

2. The method according to claim 1, wherein storing the multiple data entries comprises storing the data entries in a ternary content-addressable memory (TCAM).

3. The method according to claim 1, wherein choosing the check symbols comprises dividing each data entry into multiple clauses, and appending at least one check symbol to each clause so as to generate multiple data blocks within each entry, wherein each of the data blocks is a codeword of the linear code.

4. The method according to claim 1, wherein processing the match results comprises counting a respective number of the search keys that match each of the data entries.

5. The method according to claim 4, wherein applying the predetermined sequence of the search keys comprises choosing the search keys so that a given data entry is considered to be error-free if and only if the respective number of the search keys that match the given data entry is in a predetermined set T, and wherein processing the match results comprises identifying as erroneous at least one data entry for which the respective number is not in T.

6. The method according to claim 5, wherein T is the set of even numbers or the set of numbers that are divisible by three.

7. The method according to claim 1, wherein the data entries in the associative memory have respective match lines, which output respective match line values, and wherein processing the match results comprises cumulatively computing a hash function over the match line values while applying the sequence of the search keys, and inverting the hash function to identify one or more of the data entries in which the error has occurred.

8. A method for error detection, comprising:
storing in an associative memory multiple data entries, each data entry comprising a data item together with one or more check symbols computed with respect to the data item,
wherein the data entries in the associative memory have respective match lines, coupled to feed respective match line values to a match-line encoder which outputs an index of a matching data entry in a normal operational mode of the associative memory;
applying a predetermined sequence of search keys to the memory, thereby causing the memory to generate, in parallel, match results with respect to the data entries; and
processing the match results in order to identify an error in at least one of the data entries,
wherein processing the match results comprises counting a respective number of the search keys that match each of the data entries, and
wherein counting the respective number comprises accumulating the match line values using a respective modular counter on each of the match lines while operating the associative memory in a test mode.

9. The method according to claim 8, wherein each data item comprises information symbols, and wherein storing the multiple data entries comprises choosing the check symbols so that the information symbols together with the check symbols constitute codewords of a linear code.

10. The method according to claim 9, wherein applying the predetermined sequence of the search keys comprises defining a parity-check matrix of the linear code, and constructing the search keys using test vectors taken from the parity-check matrix.

11. Memory apparatus, comprising:
an associative memory, which is configured to store multiple data entries, each data entry comprising a data item together with one or more check symbols computed with respect to the data item,
wherein the data entries in the associative memory have respective match lines, which are configured to output respective match line values, and
wherein the associative memory comprises a test circuit, which is configured to cumulatively compute a hash function over the match line values while the sequence of the search keys is applied to the associative memory; and
a processor, which is coupled to apply a predetermined sequence of search keys to the memory, thereby causing the memory to generate, in parallel, match results with respect to the data entries, and to process the match results in order to identify an error in at least one of the data entries,
wherein the processor is configured to invert the hash function to identify the at least one of the data entries in which the error has occurred.

12. The apparatus according to claim 11, wherein the associative memory comprises a ternary content-addressable memory (TCAM).

13. The apparatus according to claim 11, wherein each data item comprises information symbols, and wherein the check symbols are chosen so that the information symbols together with the check symbols constitute codewords of a linear code.

14. The apparatus according to claim 13, wherein each data entry comprises multiple clauses, and at least one check symbol is appended to each clause so as to generate multiple data blocks within each entry, wherein each of the data blocks is a codeword of the linear code.

15. The apparatus according to claim 13, wherein the search keys comprise test vectors taken from a parity-check matrix of the linear code.

16. The apparatus according to claim 11, wherein the test circuit is configured to count a respective number of the search keys that match each of the data entries, and to output an indication of the at least one of the data entries in which the error has occurred based on the respective number.

17. The apparatus according to claim 16, wherein the search keys are chosen so that a given data entry is considered to be error-free if and only if the respective number of the search keys that match the given data entry is in a predetermined set T, and wherein the test circuit is configured to identify the at least one data entry as erroneous when the respective number is not in T.

18. The apparatus according to claim 17, wherein T is the set of even numbers or the set of numbers that are divisible by three.

19. The apparatus according to claim 16, wherein the data entries in the associative memory have respective match lines, and wherein the associative memory comprises a match-line encoder, which is coupled to receive respective match line values from the match lines and, in a normal operational mode of the associative memory, to output an index of a matching data entry, and wherein the test circuit comprises a respective modular counter on each of the match lines, which is configured to accumulate the respective match line values while the associative memory operates in a test mode.

* * * * *